(12) United States Patent
Wojcik et al.

(10) Patent No.: US 10,511,138 B2
(45) Date of Patent: Dec. 17, 2019

(54) LASER COMPONENT AND METHOD OF PRODUCING SAME

(71) Applicant: OSRAM Opto Semiconductors GmbH, Regensburg (DE)

(72) Inventors: Andreas Wojcik, Regensburg (DE); Martin Haushalter, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/754,333

(22) PCT Filed: Aug. 23, 2016

(86) PCT No.: PCT/EP2016/069891
§ 371 (c)(1),
(2) Date: Feb. 22, 2018

(87) PCT Pub. No.: WO2017/032772
PCT Pub. Date: Mar. 2, 2017

(65) Prior Publication Data
US 2018/0254605 A1  Sep. 6, 2018

(30) Foreign Application Priority Data

Aug. 27, 2015 (DE) .................. 10 2015 114 292

(51) Int. Cl.
*H01S 5/022* (2006.01)
*H01S 3/02* (2006.01)
(Continued)

(52) U.S. Cl.
CPC .......... *H01S 5/02244* (2013.01); *H01S 3/027* (2013.01); *H01S 5/005* (2013.01);
(Continued)

(58) Field of Classification Search
CPC .. H01S 5/02244; H01S 5/02256; H01S 3/027; H01S 5/02276; H01S 5/024; H01S 5/005; H01S 5/02228; H01S 5/4031
See application file for complete search history.

(56) References Cited

U.S. PATENT DOCUMENTS 7,394,952 B1  7/2008 Ueno et al.
7,564,080 B2  7/2009 Ferstl et al.
(Continued)

FOREIGN PATENT DOCUMENTS

CN  104733999 A  6/2015
DE  197 06 279 A1  8/1998
(Continued)

OTHER PUBLICATIONS

English Translation of DE102012215684 (Year: 2012).*
(Continued)

*Primary Examiner* — Yuanda Zhang
(74) *Attorney, Agent, or Firm* — DLA Piper LLP

(57) ABSTRACT

A laser component includes a housing that includes a base section including a top side and an underside, wherein a plurality of electrical soldering contact pads are configured at the underside of the base section, the electrical soldering contact pads enabling surface mounting of the laser component, a plurality of electrical chip contact pads are configured at the top side of the base section and electrically conductively connect to the soldering contact pads, the housing includes a cavity adjoining the top side of the base section, and a laser chip is arranged in the cavity and electrically conductively connects to at least some of the chip contact pads.

10 Claims, 4 Drawing Sheets

(51) Int. Cl.
 *H01S 5/00* (2006.01)
 *H01S 5/024* (2006.01)
 *H01S 5/40* (2006.01)

(52) U.S. Cl.
 CPC .......... *H01S 5/024* (2013.01); *H01S 5/02228* (2013.01); *H01S 5/02256* (2013.01); *H01S 5/02276* (2013.01); *H01S 5/4031* (2013.01)

(56) References Cited

U.S. PATENT DOCUMENTS

| | | | |
|---|---|---|---|
| 7,731,433 B1* | 6/2010 | Heinemann | G02B 6/4246 385/88 |
| 9,472,923 B2 | 10/2016 | Eckert | |
| 9,698,282 B2 | 7/2017 | Jaeger et al. | |
| 2001/0024553 A1 | 9/2001 | Nakanishi et al. | |
| 2005/0271391 A1 | 12/2005 | Togami et al. | |
| 2007/0254409 A1 | 11/2007 | Yip et al. | |
| 2008/0023713 A1* | 1/2008 | Maeda | H01L 33/486 257/98 |
| 2008/0116551 A1* | 5/2008 | Ferstl | H01S 5/02244 257/678 |
| 2009/0294789 A1 | 12/2009 | Yoshida | |
| 2011/0280266 A1 | 11/2011 | Hayashi et al. | |
| 2014/0307755 A1* | 10/2014 | Wojcik | H01S 5/02228 372/38.02 |
| 2015/0184998 A1 | 7/2015 | Sherrer | |

FOREIGN PATENT DOCUMENTS

| | | |
|---|---|---|
| DE | 10 2005 036 266 A1 | 1/2007 |
| DE | 10 2011 116 534 A1 | 4/2013 |
| DE | 10 2012 215 684 A1 | 3/2014 |
| DE | 10 2013 216 525 A1 | 2/2015 |
| DE | 10 2013 220 960 A1 | 4/2015 |
| EP | 1 312 142 B1 | 4/2006 |
| JP | 2002-31747 A | 1/2002 |
| JP | 2009-289775 A | 12/2009 |
| JP | 2011-517125 A | 5/2011 |
| JP | 2012-54527 A | 3/2012 |
| JP | 2015-510277 A | 4/2015 |
| WO | 2013/130580 A2 | 9/2013 |
| WO | 2014/154662 A1 | 10/2014 |

OTHER PUBLICATIONS

Notice of Reasons for Rejection dated Dec. 25, 2018, of counterpart Japanese Application No. 2018-506421, in English.
Notice of Reasons for Rejection dated Jul. 30, 2019, of counterpart Japanese Application No. 2018-506421, along with an English translation.
First Office Action dated May 29, 2019, of counterpart Chinese Application No. 201680050009.0, along with an English translation.

* cited by examiner

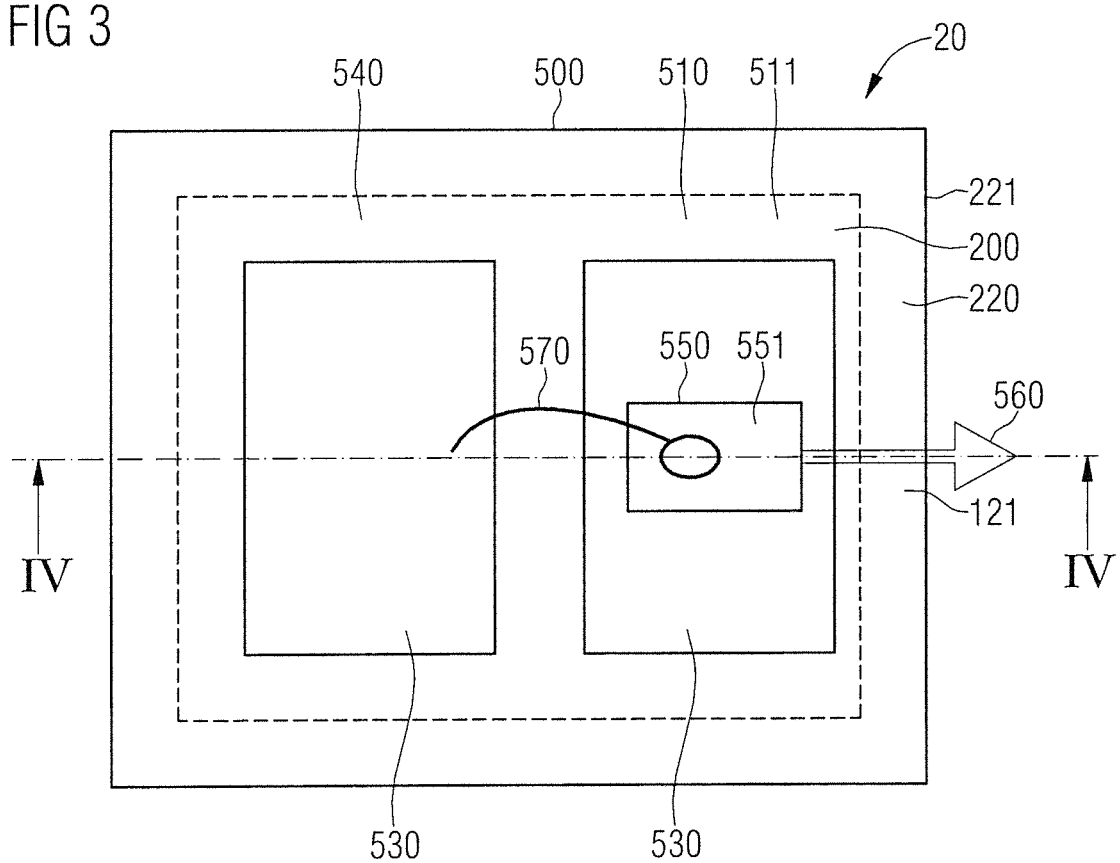
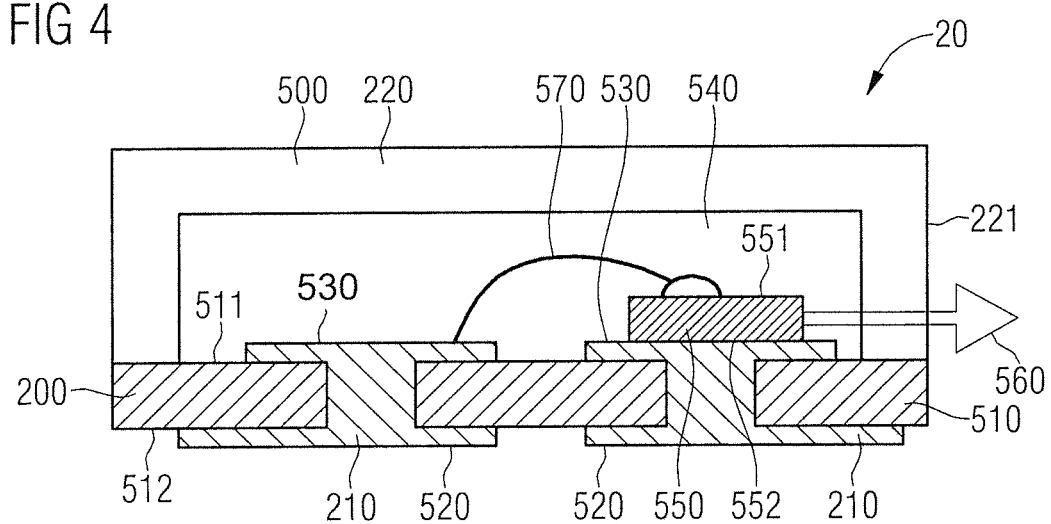

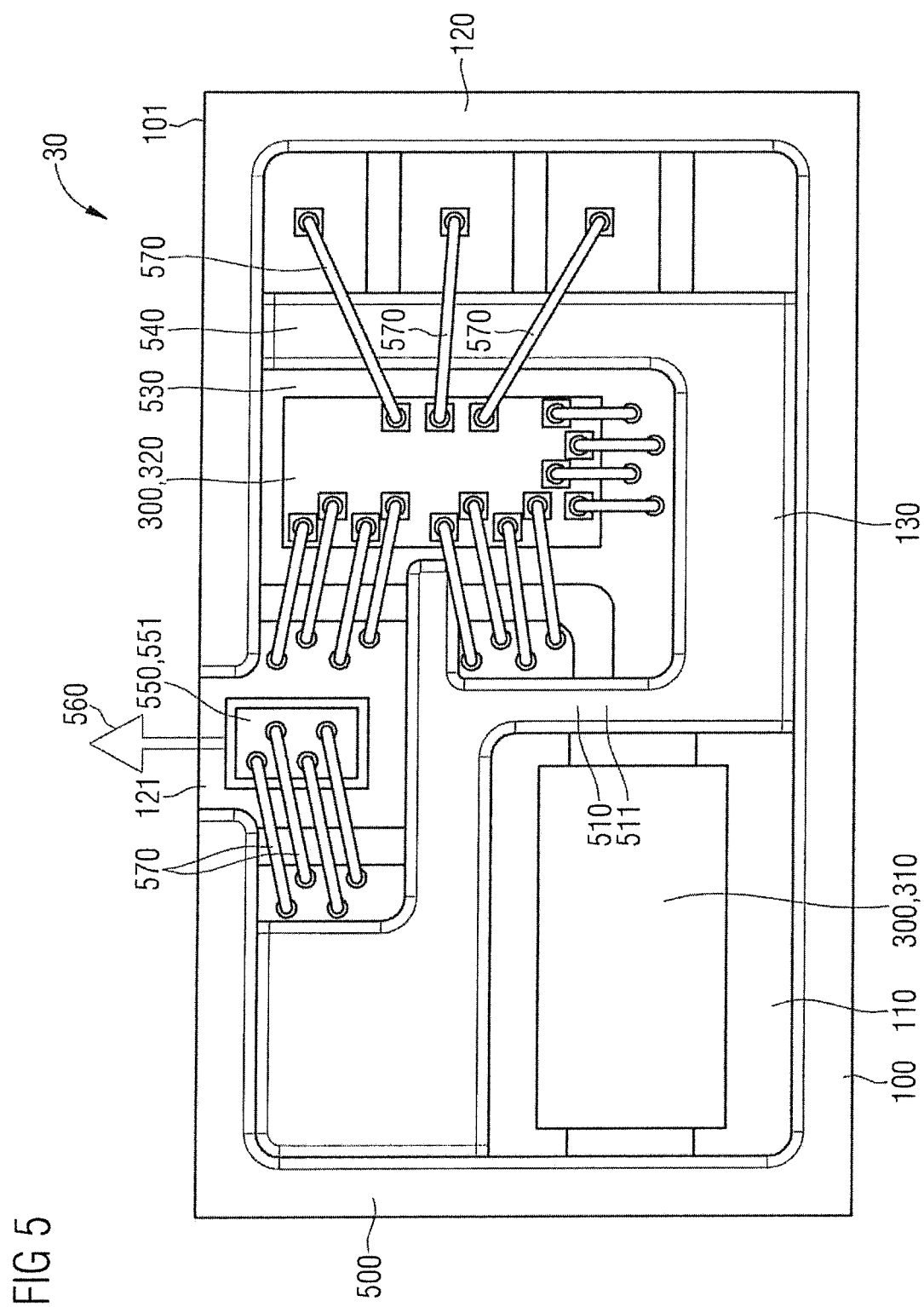

LASER COMPONENT AND METHOD OF PRODUCING SAME

TECHNICAL FIELD

This disclosure relates to a laser component and methods of producing a laser component.

BACKGROUND

Various housing designs for laser components are known. However, many known housing designs are not suitable for surface mounting. Moreover, many known housing designs comprise long conductor paths that may make operation with short pulse widths more difficult.

SUMMARY

We provide a laser component including a housing that includes a base section including a top side and an underside, wherein a plurality of electrical soldering contact pads are configured at the underside of the base section, the electrical soldering contact pads enabling surface mounting of the laser component, a plurality of electrical chip contact pads are configured at the top side of the base section and electrically conductively connect to the soldering contact pads, the housing includes a cavity adjoining the top side of the base section, and a laser chip is arranged in the cavity and electrically conductively connects to at least some of the chip contact pads.

We also provide a method of producing a laser component including providing a housing composed of a plastics material, wherein a leadframe is embedded into the plastics material in a base region of the housing, sections of the leadframe not covered by the plastics material at an underside of the base section form a plurality of electrical soldering contact pads enabling surface mounting of the laser component, sections of the leadframe not covered by the plastics material at a top side of the base section form a plurality of electrical chip contact pads that electrically conductively connect to the soldering contact pads, and the housing is configured with a cavity adjoining the top side of the base section; and arranging a laser chip in the cavity, wherein the laser chip electrically conductively connects to at least some of the chip contact pads.

We further provide a method of producing a laser component including providing a planar substrate that includes at an underside a plurality of electrical soldering contact pads enabling surface mounting of the laser component, and includes a plurality of electrical chip contact pads at a top side, wherein the substrate includes a plurality of through contacts that produce electrically conductive connections between the chip contact pads and the soldering contact pads; arranging a laser chip on the top side of the substrate, wherein the laser chip electrically conductively connects to at least some of the chip contact pads; and arranging a cover on the top side of the substrate, wherein a cavity is configured between the substrate and the cover, and the laser chip is enclosed in the cavity.

BRIEF DESCRIPTION OF THE DRAWINGS

FIG. 3 schematically shows a plan view of a second laser component.

FIG. 4 schematically shows a sectional side view of the second laser component.

FIG. 5 schematically shows a plan view of a third laser component.

Figure 1:
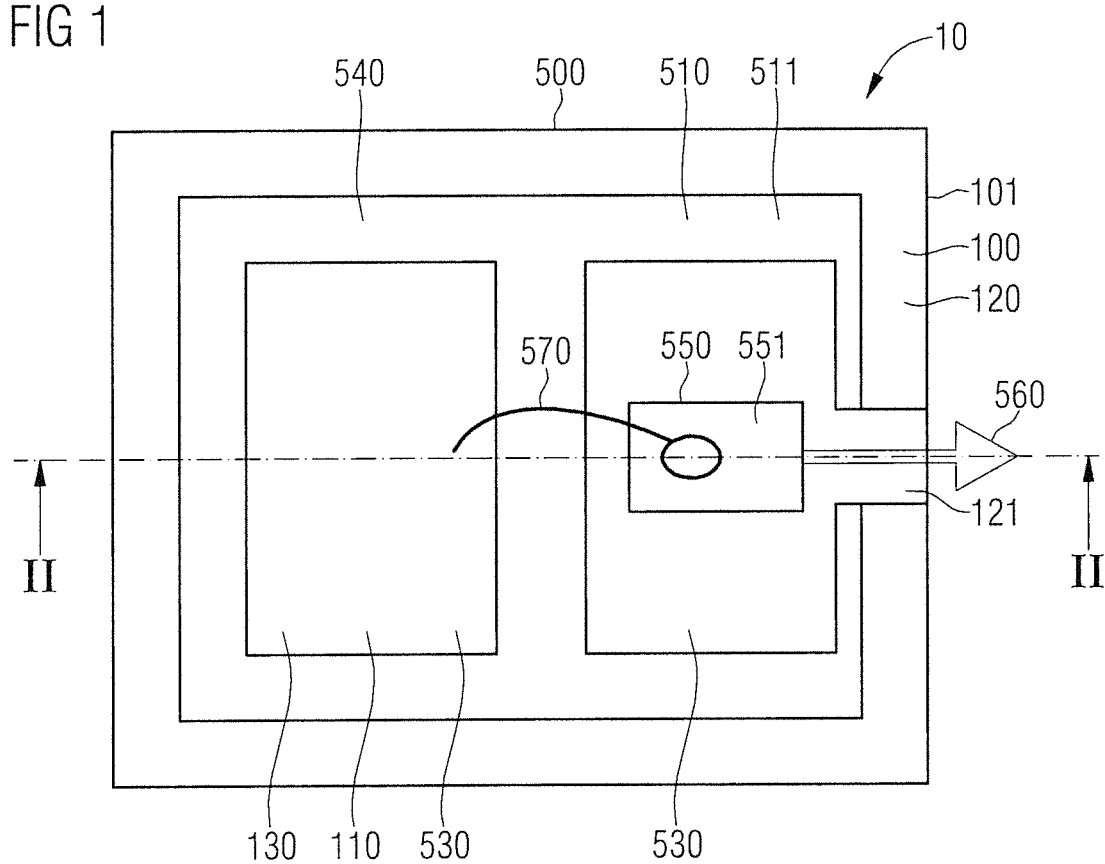
FIG. 1 schematically shows a plan view of a first laser component.

LIST OF REFERENCE SIGNS 10 first laser component
20 second laser component
30 third laser component
500 housing
510 base section
511 top side
512 underside
520 soldering contact pad
530 chip contact pad
540 cavity
550 laser chip
551 top side
552 underside
560 laser beam
570 bond wire
100 molded body
101 outer side
110 leadframe
120 wall section
121 cutout
130 potting material
200 substrate
210 through contact
220 cover
221 outer side
300 driver circuit
310 capacitor
320 integrated circuit

DETAILED DESCRIPTION

Our laser component comprises a housing comprising a base section comprising a top side and an underside. A plurality of electrical soldering contact pads are configured at the underside of the base section, the electrical soldering contact pads enabling surface mounting of the laser component. A plurality of electrical chip contact pads are configured at the top side of the base section and electrically conductively connect to the soldering contact pads. The housing comprises a cavity adjoining the top side of the base section. A laser chip is arranged in the cavity and electrically conductively connects to at least some of the chip contact pads.

This laser component is advantageously suitable for surface mounting, whereby the laser component may advantageously be mounted by automated processes.

The surface mountability of the laser component enables an effective dissipation of waste heat arising in the laser component during operation of the laser component. This in turn makes it possible to operate the laser component with high power, without overheating of the laser component occurring. By way of example, the laser component may be operated in short-pulse operation with a high pulse ratio and/or a high duty ratio.

By virtue of the fact that the soldering contact pads and the chip contact pads of this laser component are arranged at mutually opposite sides of the base section of the housing of this laser component, short conductor paths between the soldering contact pads and the chip contact pads arise in this laser component, as a result of which they have low inductances. This may make it possible, for example, to operate the laser component in short-pulse operation with very short pulse widths. By way of example, the laser component may be suitable for operation with pulse widths of less than 5 ns.

The housing may comprise a plastics material. In this case, the base section comprises a leadframe embedded into the plastics material. The soldering contact pads and the chip contact pads are formed by surfaces of sections of the leadframe. Advantageously, the housing of the laser component may thereby be produced simply and cost-effectively. In particular, a multiplicity of housings may be produced simultaneously in common work steps. Moreover, the housing may advantageously comprise compact external dimensions.

The leadframe may be configured in a planar fashion. Advantageously, this results in particularly short conductor paths between the soldering contact pads and the chip contact pads of the housing of the laser component.

The cavity may be delimited by a wall section of the housing arranged above the base section. In this case, the wall section comprises a cutout enabling passage of a laser beam emitted by the laser chip. Advantageously, the cavity bounded by the wall section in the laser component may bring about protection of the laser chip of the laser component against damage resulting from external influences. The cutout arranged in the wall section of the housing advantageously enables the laser beam emitted by the laser chip to be coupled out from the housing of this laser component with low losses.

A potting material may be arranged in the cavity, the laser chip being at least partly embedded into the potting material. The potting material may serve to protect the laser chip against damage resulting from external influences. The potting material may comprise, for example, a silicone and/or a plastic.

The potting material may also be arranged in the cutout. This advantageously enables the laser beam emitted by the laser chip to be coupled out from the housing of the laser component in a simple manner. If the housing of the laser component is produced simultaneously with a plurality of further housings in common work processes, then during the process of arranging the potting material in the cavity the potting material may pass through the cutout from the cavity of one housing into a cavity of an adjacent housing, thereby advantageously facilitating the process of arranging the potting material in the cavity.

The base section may comprise a planar substrate. In this case, the substrate comprises a plurality of through contacts that produce electrically conductive connections between the chip contact pads and the soldering contact pads. Advantageously, this substrate may be obtainable cost-effectively and thereby enable a cost-effective production of the housing of the laser component. The electrically conductive connections formed by the through contacts between the soldering contact pads and the chip contact pads of this laser component may advantageously be configured in a very short fashion and thereby comprise low inductances, which may enable operation of the laser component with short pulse widths.

The substrate may be configured as a printed circuit board or as a ceramic substrate. Advantageously, the substrate may thereby be obtainable cost-effectively and enable an effective dissipation of waste heat arising in the laser chip during operation of the laser component.

The housing may comprise a cover. In this case, the cover is arranged on the substrate. The cavity is configured between the substrate and the cover. As a result, the cover advantageously affords protection for the laser chip of this laser component against damage resulting from external influences. The cover may comprise, for example, a plastic or a glass.

The cover may connect to the substrate by an adhesive connection or a solder connection. Advantageously, this enables the cover to be secured to the substrate simply and cost-effectively and thereby enables a simple and cost-effective production of the laser component.

The cover may comprise a material transparent to laser radiation emitted by the laser chip. This advantageously enables laser radiation emitted by the laser chip of the laser component to be coupled out from the housing of the laser component with low losses.

The laser chip may be configured as an edge emitting laser chip. This advantageously enables a laser beam to be emitted in a direction parallel to the base section of the housing of the laser component.

A driver circuit that drives the laser chip may be arranged in the cavity. This advantageously enables operation of the laser component without an additional external driver circuit.

A method of producing a laser component comprises steps for configuring a housing composed of a plastics material, wherein a leadframe is embedded into the plastics material in a base region of the housing, wherein sections of the leadframe that are not covered by the plastics material at an underside of the base section form a plurality of electrical soldering contact pads enabling surface mounting of the laser component, wherein sections of the leadframe that are not covered by the plastics material at a top side of the base section form a plurality of electrical chip contact pads, which electrically conductively connect to the soldering contact pads, wherein the housing is configured with a cavity adjoining the top side of the base section, and to arrange a laser chip in the cavity, wherein the laser chip electrically conductively connects to at least some of the chip contact pads.

This method advantageously enables a simple and cost-effective production of a laser component suitable for surface mounting. By virtue of the fact that the soldering contact pads and the chip contact pads are formed by sections of the leadframe in the laser component obtainable by this method, conductor paths configured between the soldering contact pads and the chip contact pads are very short and thereby have low inductances. As a result, the laser component obtainable by this method may advantageously be suitable for short-pulse operation with low pulse widths.

The housing may be configured in a continuous fashion integrally with a plurality of further housings in a housing assemblage. In this case, the method comprises a further step of singulating the housing by dividing the housing assemblage. In this case, parallel production of a plurality of housings in a housing assemblage in common work processes may advantageously reduce the production costs per housing and the time required to produce a housing.

Dividing the housing assemblage may be carried out using a diamond grinding blade. This advantageously results in outer sides of the housing comprising high surface quality that enables a high-quality coupling-out of a laser beam emitted by the laser chip from the housing of the laser component obtainable by this method.

A further method of producing a laser component comprises steps of providing a planar substrate comprising at an underside a plurality of electrical soldering contact pads enabling surface mounting of the laser component, and comprising a plurality of electrical chip contact pads at a top side, wherein the substrate comprises a plurality of through contacts that produce electrically conductive connections between the chip contact pads and the soldering contact pads, to arrange a laser chip on the top side of the substrate, wherein the laser chip electrically conductively connects to at least some of the chip contact pads, and to arrange a cover on the top side of the substrate, wherein a cavity is configured between the substrate and the cover, wherein the laser chip is enclosed in the cavity.

Advantageously, this method also enables a simple and cost-effective production of a laser component suitable for surface mounting. By virtue of the fact that in the laser component obtainable by this method the electrically conductive connections between the soldering contact pads and the chip contact pads are formed by the through contacts of the substrate, the conductor paths between the soldering contact pads and the chip contact pads may be configured in a very short fashion and thereby comprise low inductances. This may enable short-pulse operation of the laser component obtainable by the method with short pulse widths.

The cover may be configured in a continuous fashion integrally with a plurality of further covers in a cover assemblage. In this case, the method comprises a further step of singulating the cover by dividing the cover assemblage. Advantageously, the method thereby enables parallel production of a plurality of covers in common work processes. The production costs per cover and the time required to produce a cover may advantageously be reduced as a result.

Dividing the cover assemblage may be carried out using a diamond grinding blade. As a result, the covers obtainable by dividing the cover assemblage may comprise outer sides comprising high surface quality. In the laser component obtainable by the method, this enables a high-quality coupling-out of a laser beam emitted by the laser chip from the housing of the laser component.

The above-described properties, features and advantages and the way in which they are achieved will become clearer and more clearly understood in association with the following description of the examples which are explained in greater detail in association with the drawings, in which, in each case in a schematic illustration.

Figure 2:
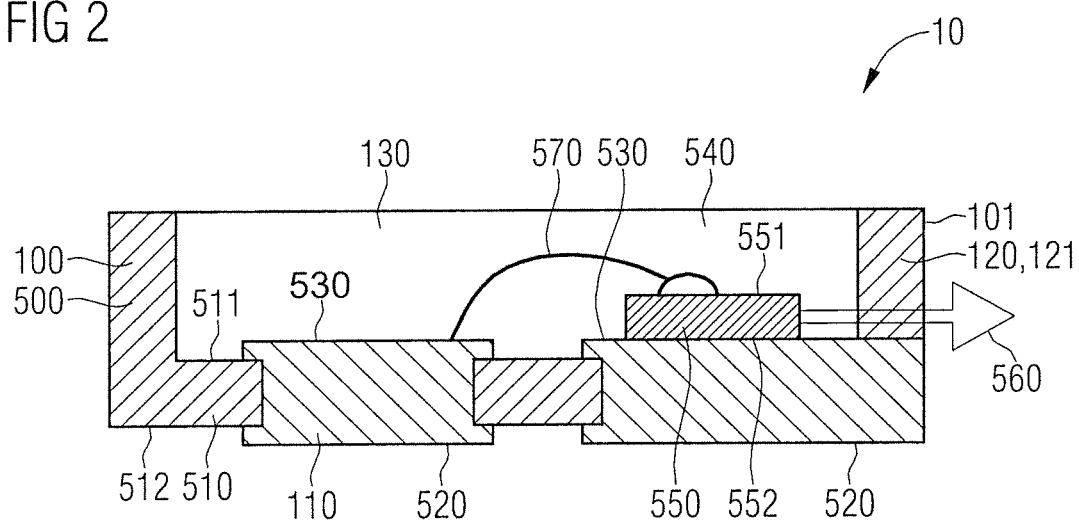
FIG. 2 schematically shows a sectional side view of the first laser component.

FIG. 1 shows a plan view of a first laser component 10 in a schematic illustration. FIG. 2 shows a schematic sectional side view of the first laser component 10. In this case, the first laser component 10 is cut on a sectional plane depicted in FIG. 1.

The first laser component 10 comprises a housing 500. The housing 500 comprises a base section 510 comprising a top side 511 and an underside 512 situated opposite the top side 511. Above the top side 511 of the base section 510, the housing 500 comprises a cavity 540 adjoining the top side 511 of the base section 510.

The housing 500 of the first laser component 10 is formed by a molded body 100. The molded body 100 may also be referred to as a mold body. The molded body 100 has been configured by a molding method (mold method), for example, by transfer molding or injection molding. The molded body 100 comprises an electrically insulating plastics material, for example, an epoxy.

In the base section 510 of the housing 500, a leadframe 110 is embedded into the molded body 100. The material of the molded body 100 was molded around the leadframe 110 already during the process of configuring the molded body 100. The leadframe 110 comprises an electrically conductive material, for example, a metal, for example, copper.

The leadframe 110 is configured in a planar fashion and comprises a plurality of sections electrically insulated from one another and arranged in a common plane. The leadframe 110 may be produced from a flat metal sheet, for example. The base section 510 of the housing 500, just like the leadframe 110 embedded into the molded body 100 in the base section 510 of the housing 500, is configured in a planar, flat and level fashion.

Both at the top side 511 and at the underside 512 of the base section 510, surfaces of sections of the leadframe 110 are exposed and not covered by the material of the molded body 100. The sections of the leadframe 110 exposed at the top side 511 of the base section 510 form a plurality of chip contact pads 530, for example, two chip contact pads 530. The sections of the leadframe 110 exposed at the underside 512 of the base section 510 form a plurality of soldering contact pads 520, for example, two soldering contact pads 520.

Via the sections of the leadframe 110, each soldering contact pad 520 electrically conductively connects to a respective chip contact pad 530. In this case, the conductor paths formed by the sections of the leadframe 110 are very short and extend substantially perpendicularly through the base section 510 of the housing 500. As a result, the conductor paths formed by the sections of the leadframe 110 between the soldering contact pads 520 and the chip contact pads 530 comprise low inductances.

The soldering contact pads 520 arranged at the flat underside 512 of the base section 510 of the housing 500 enable surface mounting (SMT mounting) of the first laser component 10. The first laser component 10 thus forms an SMD component. The first laser component 10 may be suitable, for example, for surface mounting by reflow soldering.

The housing 500 of the first laser component 10 comprises a wall section 120 formed by the molded body 100, the wall section bounding the top side 511 of the base section 510 in a ring-shaped fashion and thereby delimiting the cavity 540 configured above the top side 511 of the base section 510.

In the cavity 540 of the housing 500 of the first laser component 10, a laser chip 550 is arranged at the top side 511 of the base section 510. The laser chip 550 may be, for example, an edge emitting semiconductor laser chip. The laser chip 550 comprises a top side 551 and an underside 552 situated opposite the top side 551. A respective electrical contact pad of the laser chip 550 is configured at the top side 551 and at the underside 552 of the laser chip 550.

The electrical contact pads of the laser chip 550 electrically conductively connect to a respective chip contact pad 530. In the example shown in FIGS. 1 and 2, the laser chip 550 is arranged on one of the chip contact pads 530 such that the underside 552 of the laser chip 550 faces the chip contact pad 530 and the electrical contact pad of the laser chip 550 configured at the underside 552 of the laser chip 550 electrically conductively connects to the chip contact pad 530. For this purpose, the laser chip 550 may be secured to the chip contact pad 530, for example, by a solder or an electrically conductive adhesive. In the example shown in FIGS. 1 and 2, the electrical contact pad of the laser chip 550 configured at the top side 551 of the laser chip 550 connects to a further chip contact pad 530 of the housing 500 of the first laser component 10 by a bond wire 570. It is possible, however, to produce the electrically conductive connections between the electrical contact pads of the laser chip 550 and the chip contact pads 530 in some other way.

The laser chip 550 is configured to emit a laser beam 560 in a direction oriented substantially parallel to the underside 552 of the laser chip 550. The emission direction of the laser chip 550 is thus also oriented parallel to the top side 511 of the base section 510 of the housing 500.

The wall section 120 of the molded body 100 forming the housing 500 of the first laser component 10 comprises a cutout 121. The wall section 120 bounding the top side 511 of the base section 510 in a ring-shaped fashion is interrupted in the region of the cutout 121. The cutout 121 enables passage of the laser beam 560 emitted by the laser chip 550 of the first laser component 10. The laser beam 560 emitted by the laser chip 550 may emerge from the cavity 540 of the housing 500 of the first laser component 10 through the cutout 121. The cutout 121 may already have been created during the process of configuring the molded body 100. However, it is likewise possible for the cutout 121 to be created only after the process of configuring the molded body 100, for example, by a sawing or grinding process.

A potting material 130 is arranged in the cavity 540 of the housing 500 of the first laser component 10. The laser chip 550 and the bond wire 570 connecting the laser chip 550 to one of the chip contact pads 530 are at least partly embedded into the potting material 130 and thereby protected against damage resulting from external influences, for example, against damage resulting from moisture. The potting material 130 may comprise a silicone, for example. It is expedient for the potting material 130 to comprise a high transparency to laser radiation emitted by the laser chip 550. The potting material 130 may also extend into the cutout 121 of the wall section 120. It is possible to dispense with arranging the potting material 130 in the cavity 540.

The housing 500 of the first laser component 10 may be produced jointly with a plurality of further housings 500 in common work steps. For this purpose, an extensive leadframe assemblage is embedded into an extensive molded body assemblage comprising a plurality of molded bodies 100 connected to one another integrally in a continuous fashion and arranged laterally alongside one another, for example, in a two-dimensional rectangular lattice arrangement. In this case, the wall sections 120 of a molded body 100 adjoin the wall sections 120 of adjacent molded bodies 100.

Afterward, laser chips 550 are arranged in the cavities 540 of all the molded bodies 100 and electrically conductively connect to the chip contact pads 530. The potting material 130 is likewise introduced jointly for all the molded bodies 100 of the molded body assemblage. In this case, the potting material 130 may flow through the cutouts 121 between the cavities 540 of the individual molded bodies 100.

It is only upon the conclusion of these common processing steps that the housing assemblage thus formed is divided to singulate the individual housings 500 formed by the individual molded bodies 100. Dividing the molded body assemblage may be carried out, for example, by sawing or some other separating method. In this case, outer sides 101 of the wall sections 120 of the molded bodies 100 are formed at the separating planes.

If the potting material 130 in the case of the individual molded bodies 100 respectively extends right into the cutout 121 of the wall section 120, then during the process of singulating the molded bodies 100 a separating face is also formed in the region of the potting material 130 in the cutout 121. The separating face forms an emission face for the laser beam 560 emitted by the laser chip 550. It is therefore expedient for the separating face to be configured as smoothly as possible. This may be achieved by controlling the separating method used to divide the housing assemblage, for example, by using a diamond grinding blade.

FIG. 3 shows a schematic plan view of a second laser component 20. FIG. 4 shows a schematic sectional side view of the second laser component 20. In this case, the second laser component 20 in the illustration in FIG. 4 is cut on a sectional plane depicted in FIG. 3.

The second laser component 20 comprises correspondences to the first laser component 10 in FIGS. 1 and 2. Component parts of the second laser component 20 corresponding to component parts present in the first laser component 10, in FIGS. 3 and 4, are provided with the same reference signs as in FIGS. 1 and 2.

The second laser component 20 comprises a housing 500. The housing 500 comprises a base section 510, which is formed by a planar substrate 200, and a cover 220.

The base section 510 formed by the planar substrate 200 comprises a top side 511 and an underside 512 situated opposite the top side 511. The substrate 200 may be configured, for example, as a printed circuit board (PCB) or a ceramic substrate.

A plurality of electrical soldering contact pads 520, for example, two soldering contact pads 520 are configured at the underside 512 of the base section 510. A plurality of electrical chip contact pads 530, for example, two electrical chip contact pads 530 are configured at the top side 511 of the base section 510. The substrate 200 comprises electrically conductive through contacts 210 that extend through the substrate 200 and produce electrically conductive connections between the soldering contact pads 520 and the chip contact pads 530. In this case, each soldering contact pad 520 connects to a respective chip contact pad 530. The conductor paths formed by the through contacts 210 between the soldering contact pads 520 and the chip contact pads 530 are very short and thereby comprise low inductances.

The soldering contact pads 520 arranged at the flat underside 512 of the base section 510 of the housing 500 of the second laser component 20 enable surface mounting (SMT mounting) of the second laser component 20. The second laser component 20 thus forms an SMD component. The second laser component 20 may be suitable, for example, for surface mounting by reflow soldering.

The cover 220 is arranged at the top side 511 of the base section 510 (formed by the substrate 200) of the housing 500 of the second laser component 20. The cover 220 may connect to the substrate 200, for example, by an adhesive connection or a solder connection.

A cavity 540 is enclosed between the cover 220 and the top side 511 of the base section 510 formed by the substrate 200, the cavity adjoining the top side 511 of the base section 510.

A laser chip 550 is arranged in the cavity 540 of the second laser component 20. The laser chip 550 was arranged at the top side 511 of the base section 510 already before the process of arranging the cover 220. The laser chip 550 may be configured, for example, as an edge emitting laser chip. The laser chip 550 comprises a top side 551 and an underside 552 situated opposite the top side 551.

In the example illustrated in FIGS. 3 and 4, the laser chip 550 comprises a respective electrical contact pad at the top side 551 and at the underside 552. These electrical contact pads electrically conductively connect to chip contact pads 530 of the housing 500 of the second laser component 20.

For this purpose, in the example illustrated, the laser chip 550 is arranged and secured on a chip contact pad 530 such that the underside 552 of the laser chip 550 faces the chip contact pad 530 and the electrical contact pad configured at the underside 552 of the laser chip 550 electrically conductively connects to the chip contact pad 530. In this case, the laser chip 550 may be secured to the chip contact pad 530, for example, by a solder or electrically conductive adhesive. In the example shown in FIGS. 3 and 4, the electrical contact pad of the laser chip 550 configured at the top side 551 of the laser chip 550 connects to a further chip contact pad 530 by a bond wire 570.

The laser chip 550 is configured to emit a laser beam 560 in a direction substantially perpendicular to the top side 551 of the laser chip 550 and thus also to the top side 511 of the base section 510. The laser beam 560 emitted by the laser chip 550 may penetrate through the cover 220 and thereby emerge from the cavity 540 of the housing 500 of the second laser component 20. For this purpose, the cover 220 comprises a material transparent to laser radiation emitted by the laser chip 550. The cover 220 may comprise, for example, a plastics material or a glass.

The cover 220 of the second laser component 20 may be produced jointly with a plurality of further covers in common processing steps. A cover assemblage comprising a plurality of integrally continuous covers 220 is configured for this purpose. The covers 220 are subsequently singulated by dividing the cover assemblage on separating planes. In this case, outer sides 221 of the covers 220 are formed on the separating planes.

Dividing the cover assemblage may be carried out, for example, by a sawing process or some other separating process. It is expedient for the outer sides 221 of the covers 220, the outer sides being formed during the process of dividing the cover assemblage, to comprise a high surface quality comprising only small separating traces in the case of each cover 220 at least in the region in which the laser beam 560 penetrates through in the case of the second laser component 20 produced from the cover 220. This may be achieved by controlling the separating method used to divide the cover assemblage, for example, by using a diamond grinding blade.

Figure 6:
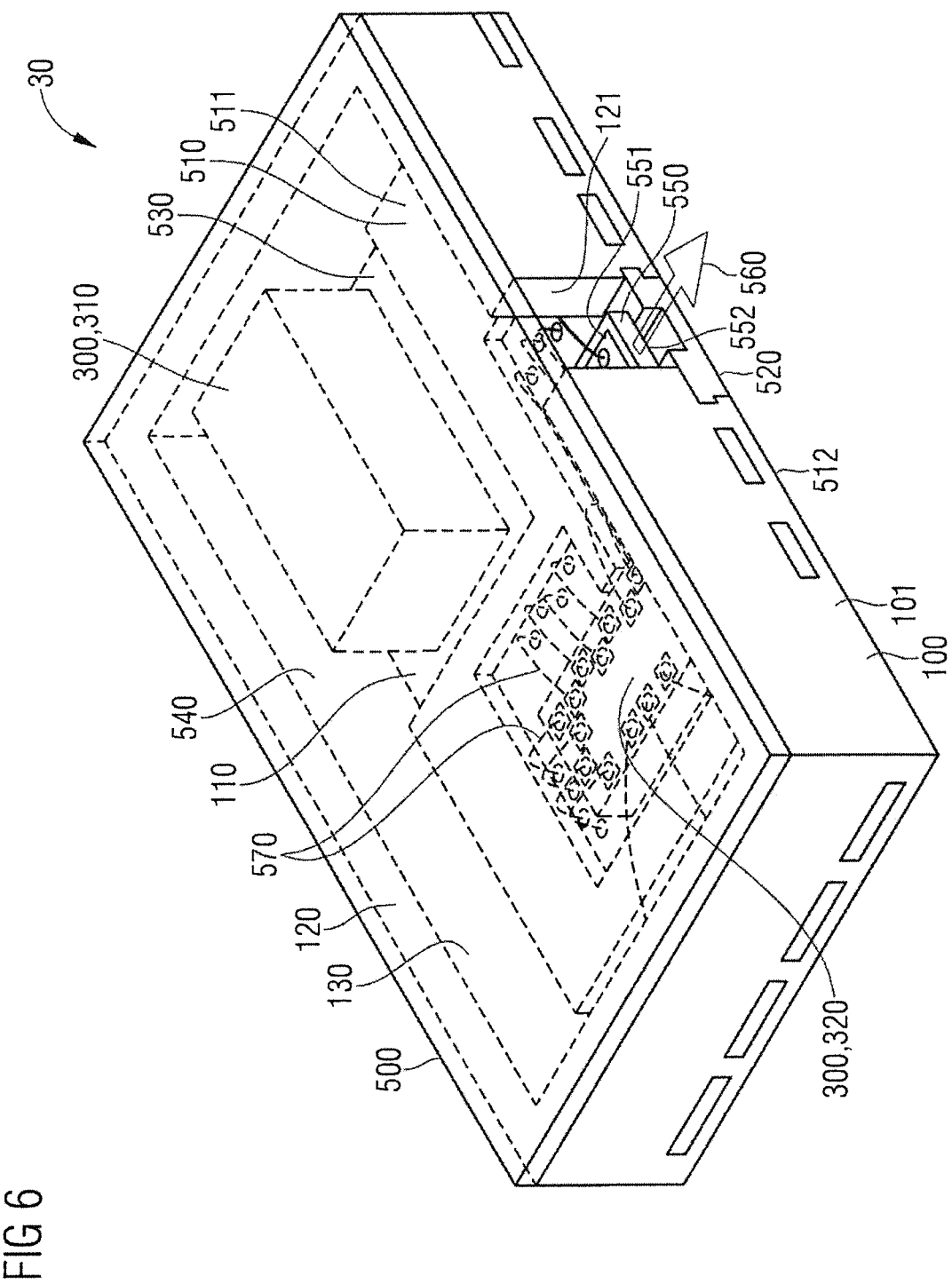
FIG. 6 schematically shows a perspective view of the third laser component.

FIG. 5 shows a plan view of a third laser component 30 in a schematic illustration. FIG. 6 shows a schematic perspective illustration of the third laser component 30.

The third laser component 30 comprises great correspondences to the first laser component 10 described with reference to FIGS. 1 and 2. Component parts of the third laser component 30 corresponding to component parts present in the first laser component 10, in FIGS. 5 and 6, are provided with the same reference signs as in FIGS. 1 and 2 and are not described in detail again below. Hereinafter, only the differences between the third laser component 30 and the first laser component 10 are explained.

In the third laser component 30, in addition to the laser chip 550, a driver circuit 300 that drives the laser chip 550 is arranged in the cavity 540. In the example shown in FIGS. 5 and 6, the driver circuit 300 comprises a capacitor 310 and an integrated circuit 320. The capacitor 310 may serve as an electrical energy store. The integrated circuit 320 may switch the laser chip 550 and may be configured to be pulsed by a TTL signal. Instead of the integrated circuit 320, the driver circuit 300 could also comprise a transistor that switches the laser chip 550.

In the third laser component 30, the housing 500 comprises more than two chip contact pads 530 and may also comprise more than two soldering contact pads 520. The chip contact pads 530 receive and contact the laser chip 550 and also the component parts of the driver circuit 300. The laser chip 550 and the component parts of the driver circuit 300 electrically conductively connect to one another and to the chip contact pads 530 via bond wires 570.

It is possible for the second laser component 20 described with reference to FIGS. 3 and 4 also to be equipped with an integrated driver circuit 300. In this case, the housing 500 of the second laser component 20 may comprise more than two chip contact pads 530 and more than two soldering contact pads 520.

In the first laser component 10, the second laser component 20 and the third laser component 30, the conductor paths connecting the soldering contact pads 520 to the chip contact pads 530 are each very short and comprise low inductances. As a result, the first laser component 10, the second laser component 20 and the third laser component 30 are each suitable for short-pulse operation with very short pulse widths. By way of example, the first laser component 10, the second laser component 20 and the third laser component 30 may be suitable for operation with pulse widths of less than 5 ns.

The first laser component 10, the second laser component 20 and the third laser component 30 are each suitable for surface mounting according to an SMT method, for example, for surface mounting by reflow soldering. As a result, the first laser component 10, the second laser component 20 and the third laser component 30 are suitable for automatic placement processes.

The surface mountability of the first laser component 10, of the second laser component 20 and the third laser component 30 enables a good thermal coupling of the laser components 10, 20, 30 and, as a result, an effective dissipation of waste heat arising in the laser components 10, 20, 30 during operation of the laser components 10, 20, 30. The waste heat may flow away in each case via the underside 512 of the base section 510 of the housing 500 of the laser component 10, 20, 30 into a carrier carrying the laser component 10, 20, 30. The good thermal coupling of the laser components 10, 20, 30 that is made possible as a result enables operation of the laser components 10, 20, 30 with a high degree of capacity utilization and long switched-on durations.

Our components and methods have been illustrated and described in greater detail on the basis of the preferred examples. Nevertheless, this disclosure is not restricted to the examples disclosed. Rather, other variations may be derived therefrom by those skilled in the art, without departing from the scope of protection of the appended claims.

This application claims priority of DE 10 2015 114 292.9, the subject matter of which is incorporated herein by reference.

The invention claimed is:

1. A laser component comprising a housing that comprises a base section comprising a top side and an underside,
   wherein a plurality of electrical soldering contact pads are configured at the underside of the base section, said electrical soldering contact pads enabling surface mounting of the laser component,
   a plurality of electrical chip contact pads are configured at the top side of the base section and electrically conductively connect to the soldering contact pads,
   the housing comprises a cavity adjoining the top side of the base section,
   the housing comprises a plastics material, a laser chip is arranged in the cavity and electrically conductively connects to at least some of the chip contact pads, the base section comprises a leadframe embedded into the plastics material, the soldering contact pads and the chip contact pads are formed by surfaces of sections of the leadframe, the leadframe is completely planar, and the laser chip comprises an electrical contact pad configured at an underside of the laser chip, wherein the laser chip is arranged on one of the chip contact pads such that the underside of the laser chip faces the chip contact pad.

2. The laser component according to claim 1, wherein the cavity is delimited by a wall section of the housing arranged above the base section, and the wall section comprises a cutout enabling passage of a laser beam emitted by the laser chip.

3. The laser component according to claim 2, wherein a potting material is arranged in the cavity, and the laser chip is at least partly embedded into said potting material.

4. The laser component according to claim 3, wherein the potting material is also arranged in the cutout.

5. The laser component according to claim 1, wherein the laser chip is configured as an edge emitting laser chip.

6. The laser component according to claim 1, wherein a driver circuit that drives the laser chip is arranged in the cavity.

7. The laser component according to claim 6, wherein the driver circuit comprises a capacitor and a transistor or an integrated circuit.

8. A method of producing a laser component comprising: providing a housing composed of a plastics material, wherein a leadframe is embedded into the plastics material in a base section of the housing, sections of the leadframe not covered by the plastics material at an underside of the base section form a plurality of electrical soldering contact pads enabling surface mounting of the laser component, sections of the leadframe not covered by the plastics material at a top side of the base section form a plurality of electrical chip contact pads that electrically conductively connect to the soldering contact pads, and the housing is configured with a cavity adjoining the top side of the base section; and arranging a laser chip in the cavity such that the laser chip electrically conductively connects to at least some of the chip contact pads, wherein the leadframe is completely planar, and the laser chip comprises an electrical contact pad configured at an underside of the laser chip, wherein the laser chip is arranged on one of the chip contact pads such that the underside of the laser chip faces the chip contact pad.

9. The method according to claim 8, wherein the housing is configured in a continuous fashion integrally with a plurality of further housings in a housing assemblage, and the method further comprises:

singulating the housing by dividing the housing assemblage.

10. The method according to claim 9, wherein dividing the housing assemblage is carried out using a diamond grinding blade.

* * * * *